United States Patent [19]

Wybourne et al.

[11] Patent Number: 5,347,141
[45] Date of Patent: Sep. 13, 1994

[54] MULTITERMINAL LATERAL S-SHAPED NEGATIVE DIFFERENTIAL CONDUCTANCE DEVICE

[75] Inventors: Martin N. Wybourne, Eugene, Oreg.; Doran D. Smith, Brick, N.J.; Stephen M. Goodnick, Corvallis, Oreg.; Jong-Ching Wu; Chris Berven, both of Eugene, Oreg.

[73] Assignee: The United States of America as represented by the Secretary of the Army, Washington, D.C.

[21] Appl. No.: 149,256

[22] Filed: Nov. 9, 1993

[51] Int. Cl.$^5$ .................................... H01L 29/80
[52] U.S. Cl. ........................ 257/24; 257/192; 257/6
[58] Field of Search ............. 257/192, 194, 6, 24

[56] References Cited

U.S. PATENT DOCUMENTS

| | | | |
|---|---|---|---|
| 4,903,092 | 2/1990 | Luryi et al. | 257/183.1 |
| 4,942,438 | 7/1990 | Miyamoto | 257/192 |
| 5,192,986 | 3/1993 | Ando | 257/192 |

OTHER PUBLICATIONS

Hess et al, Journal of Applied Physics 60, p. 3775, 1986.
Emanuel et al, Solid State Electronics 31, p. 589, 1988.

*Primary Examiner*—Robert Limanek
*Attorney, Agent, or Firm*—Michael Zelenka; William H. Anderson

[57] ABSTRACT

The present invention (or multi-terminal lateral hot-electron transistor, LHET) is based on a high electron mobility (hot-electron) transistor with a split-gate arrangement similar to those used in quantum wave guide devices. In the present invention, the depletion below the split gate is used to form, and control, potential barriers between the source and drain contacts. The devices, according to the present invention, exhibit pronounced SNDC which is controlled by the gate bias.

4 Claims, 4 Drawing Sheets

MULTITERMINAL LATERAL S-SHAPED NEGATIVE DIFFERENTIAL CONDUCTANCE DEVICE

GOVERNMENT INTEREST

The invention described herein may be made, used, sold or licensed by, or on behalf of, the Government of the United States of America without the payment to us of any royalty thereon.

FIELD OF THE INVENTION

The present invention relates to devices exhibiting. S-shaped negative differential conductance.

BACKGROUND OF THE INVENTION

Heretofore, many solid state electronic devices have been shown to exhibit negative differential conductivity. Perhaps the first of such devices to be developed and understood is now commonly termed the Gunn diode. By negative differential resistance, it is meant that the current decreases as the field increases. This effect is important in microwave applications, such as in local oscillators or power amplifiers. Negative differential resistance arises in semiconductors which have two conduction bands, those with a lower valley and a higher mobility and a low mobility and high valley in the conduction band. The two minima are commonly referred to as the lower and upper valleys, respectively. As the electric field within the bulk semiconductor is increased, a point is reached at which some electrons are scattered from the high mobility, lower valley to the low mobility, upper valley and, as a result, the average carrier drift velocity is reduced as the electric field is increased after scattering to the upper valley commences. Hence, the current through the semiconductor decreases after this point because of the decrease in average carrier mobility even with the voltage increase. The negative differential resistance leads to, for example, the generation of coherent microwave radiation at a frequency between 1 GHz and 100 GHz. See U.S. Pat. No. 4,903,092, issued to Luryi et al on Feb. 20, 1990 which is incorporated by reference hereto.

At a sufficiently high bias, these devices switch from one conducting state to another, and under appropriate bias can be made to oscillate between the conducting states. It has been demonstrated that a heterostructure hot-electron diode in which the current voltage characteristics of single and multiple GaAs/AlGaAs barriers have an S-shaped negative differential conductivity (SNDC) at low temperatures. Hess et al, *Journal of Applied Physics* 60, pg. 3776, 1986. It has also been demonstrated that the instability of this device is the result of a change in the conduction mechanism from low bias tunneling through the AlGaAs barrier to high bias thermionic emission of hot-electrons over the barrier. Emanuel et al, *Solid State Electronics* 31, pg. 589, 1988. The interest, of course, in these devices has been due to their potential application as oscillators since they have very short switching times.

SUMMARY OF THE INVENTION

Accordingly, one object of the present invention is to provide for a negative differential conductance device which operates in a lateral configuration and may be operated at relatively low bias voltages.

Another object of the present invention is to provide for such a device which is tunable.

These and other objects of the invention are achieved by the present invention which is based on a lateral semiconductor device having a heterointerface such that a double real space constriction and potential barrier is formed around a region containing a cache of electrons, such as a high mobility (hot-electron) transistor with a split-gate arrangement similar to those used in quantum wave guide devices, wherein a depletion layer formed below a split gate is used to form and control potential barriers between the source and drain contacts. For purposes of this application, a region containing a cache of electrons refers to a two dimensional electron gas laterally confined by a split gate which contains from approximately 50 to as much as several hundred electrons. An example of the layering of the heterostructure according to the present invention consists of a single $Al_xGa_{1-x}As/GaAs$ interface ($x=0.25$) on an undoped GaAs layer where the AlGaAs interface incorporates five Si delta-doped layers, four of $1\times10^{12}$ cm$^{-2}$ and one of $3\times10^{12}$ cm$^{-2}$. With this configuration, the present invention would exhibit pronounced SNDC which can be controlled by the gate bias.

The difference between the previous devices and the present invention is that in the previous devices the probability of ballistic transport was high, whereas in a device in accordance with the present invention, inelastic scattering of the hot electrons entering the electron cache region makes the probability of ballistic transport low, thus resulting in electron cache heating which initiates the SNDC. Moreover, unlike the heterostructure hot-electron diodes described above, the present invention formed from a hot electron transistor has a current-voltage characteristic which is symmetric about a zero source-drain bias and which switches at lower voltages depending on the gate bias.

BRIEF DESCRIPTION OF THE DRAWINGS

The present invention will be more readily understood in light of the Detailed Description of the Invention and the attached drawings wherein:

FIG. 1a is a-prospective view of a heterostructure semiconductor device according to the present invention and FIG. 1b is a top viewof one configuration for the split gate shown in FIG. 1a.

DETAILED DESCRIPTION OF THE PRESENT INVENTION

Figure 4:
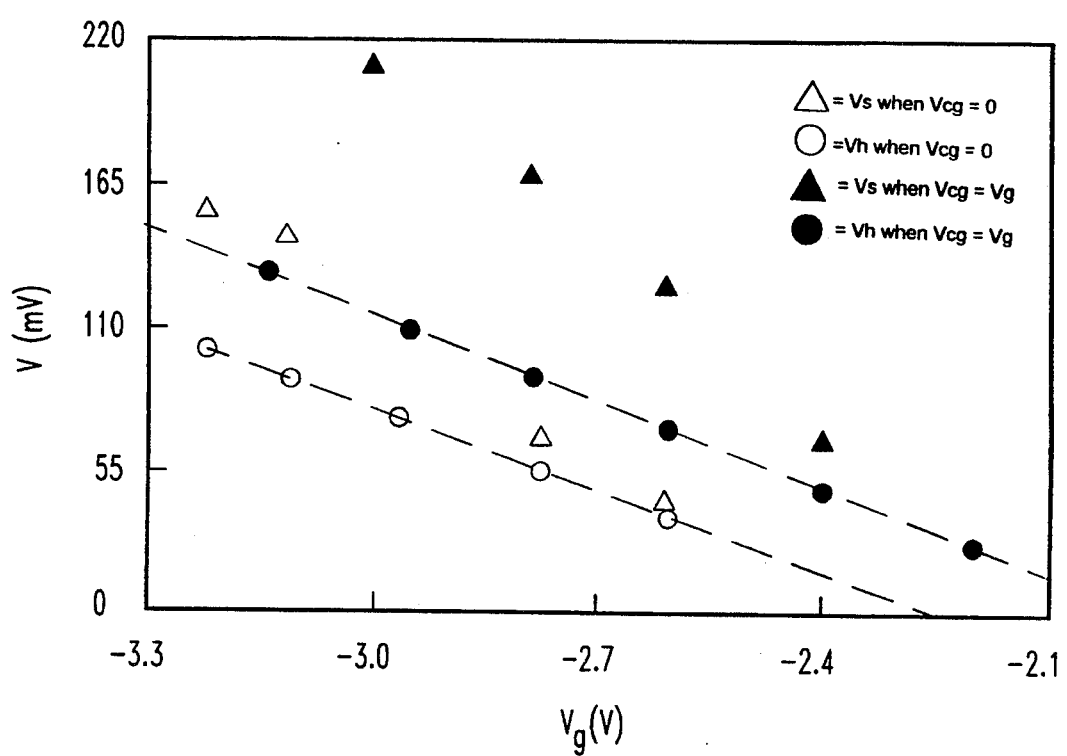
FIG. 4 is a graphical representation of the dependance of $V_s$ and $V_h$ respectively with $V_g$.

Now referring to FIG. 1a and FIG. 1b, there is shown a hot electron transistor structure which may be used to form a device according to the present invention wherein the transistor device comprises four electrodes that may be independently biased. An example of a split gate electrode configuration for the present invention would include three narrow electrodes 5, 10 and 15 (shown in FIGS. 1a and 1b) are externally connected together and biased as one. The larger center gate electrode 20 is either grounded or held at the same potential as the other three electrodes 5, 10, 15. Although only one split gate electrode configuration has been illustrated, those skilled in the art will recognize that other configurations are also useful depending particular application.

An example of the layering of the heterostructure used in accordance with the present invention consists of a single $Al_xGa_{1-x}As/GaAs$ interface (x=0.25) on an undoped GaAs layer where the AlGaAs interface incorporates five Si delta-doped layers, four of $1 \times 10^{12}$ $cm^{-2}$ and one of $3 \times 10^{12}$ $cm^{-2}$, and a 40 nm spacer between the lowest delta layer and the two-dimensional electron gas (2DEG) (or electron cache region as depicted by reference numeral 25 in FIGS. 1a and 1b). This structure creates a double real space constriction and potential barrier around the electron cache region which limits the number of electrons in the cache to a range of fifty to several hundred electrons. As an example, the 2DEG density in the as-grown material would measure to be $3.7 \times 10^{11}$ $cm^{-2}$ and have an electron mobility at 4.2K, which equates to $1.2 \times 10^6$ $cm^2/Vs$ as measured by Hall and Shubnikov-de Haas techniques.

As those skilled in the art will readily recognize, this structure may be fabricated with known epitaxy techniques, such as molecular beam epitaxy (MBE). The invention, in the preferred embodiment, is originally fabricated without gates using conventional optical lithography and processing and source and drain regions are made from Au/Ag/Ni/Ge ohmics with Ti/Pd/Au bonding pads. The device is then mesa etched for isolation. The gate structures may be defined in a positive resist using electron beam lithography. Thereafter, following thermal deposition of 5 nm of Ti and 25 nm of Au, the gate pattern is transferred to the surface of the heterostructure by a liftoff procedure.

Figure 2:
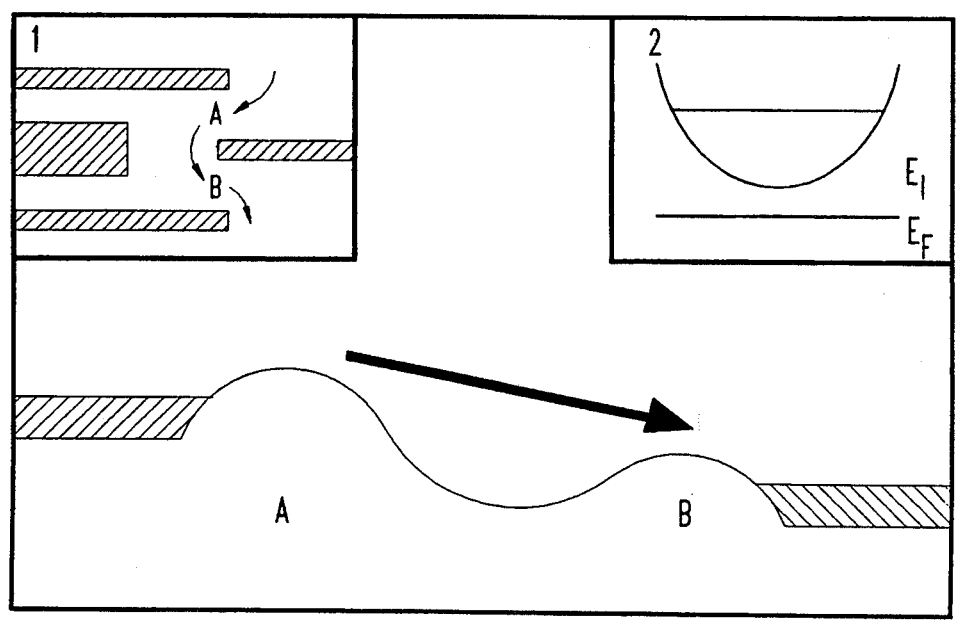
FIG. 2 is a schematic illustration of the energy band profile for a device according to the present invention wherein inset 1 indicates the point contact regions A and B wherein the barriers are formed and inset 2 represents the electrostatic potential from the gate in the point contact regions in the off state.

In operation, a sufficiently large negative bias is applied to the gate causing the 2DEG beneath the electrodes to become depleted leaving two point contacts, regions A and B of inset 1 to FIG. 2, in the current path between the source and drain. In the off state, the Fermi energy in the 2DEG on the negatively biased side of the device is below the energy of the lowest propagating mode of the point contacts, as depicted in inset 2 to FIG. 2. As such, the two channels A and B are a double barrier structure in which the barrier height corresponds to the cut-off energy of the point contact. Thus, the barrier heights are a function of the applied gate voltage, $V_g$. This operation of and the mechanism for SNDC in the present invention is similar to that proposed by Hess et al for the heterostructure hot-electron diode. Accordingly, in the off state, most of the source-drain voltage will drop across the two barriers. However, when the source-drain potential is increased two effects occur: first, the number of electrons injected across the first barrier increased; and second, the electrons are injected into the electron cache region between the two barriers with increasing amounts of excess kinetic energy. This excess kinetic energy is lost through intercarrier collisions with cold electrons in the electron cache region, thereby raising the ambient temperature of the electrons in the electron cache region. At a certain critical current density, thermionic emission of hot electrons across the second barrier increases dramatically, which gives rise to the observed SNDC, as depicted in FIG. 4. Therefore, by making $V_g$ more negative, the effective barrier height is increased which, in turn, requires a larger source to drain voltage, $V_{sd}$, to achieve the critical current. As those skilled in the art will appreciate, this causes a switching to occur. Alternatively, by making the potential more negative on the center gate, the potential energy minimum for electrons int he electron cache region is increased, which decreases the excess kinetic energy of the injected electrons. Therefore, a larger $V_{sd}$ is required to initiate hot electron switching.

Representative dc source-drain current-voltage (I-V) characteristics of the device were obtained from a device fabricated in accordance with the present invention for various voltages on the three narrow gates $V_g$ and with different voltages, $V_{cg}$, on the large center gate. Measurements were performed at 4.2K with the device in series with a 40 k$\Omega$ sense resistor, thus enabling independent measurements of the source-drain voltage $V_{sd}$ and the current $I_{sd}$. The I-V characteristics were measured using both a sampling system and a curve tracer, and were found to be the same.

Figure 3:
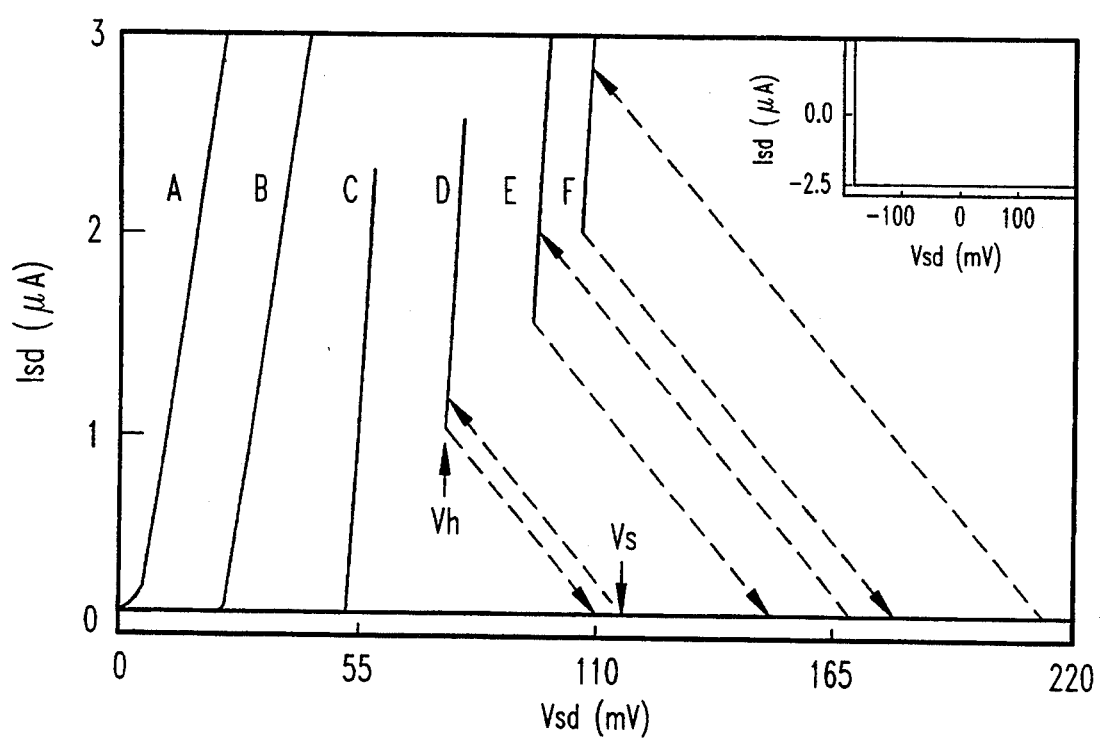
FIG. 3 is a graphical representation of the source-drain characteristics of a device according to the present invention.
Figure 4:
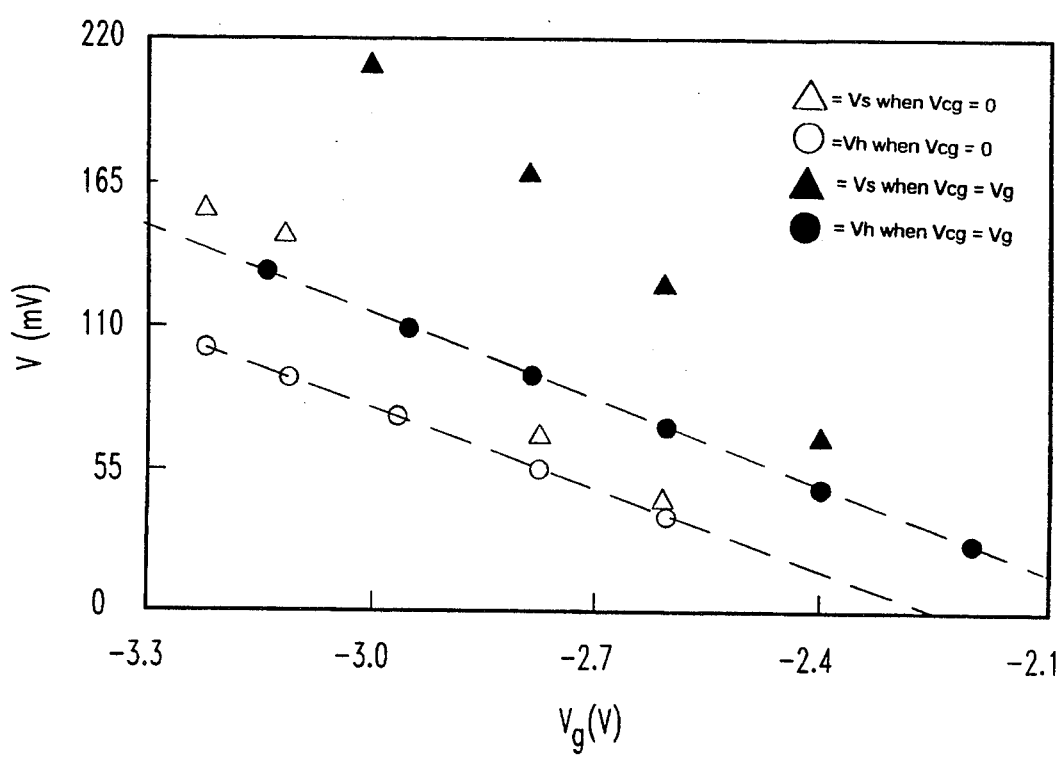

Further, the I-V characteristics of the device were measured by a sampling system with $V_{cg}=V_g$, wherein the results of the measurements are shown in FIG. 3. As shown, when $V_g$ is reduced below $-2.0$ V, SNDC occurs and becomes stronger as $V_g$ becomes more negative. The impedance difference between the low impedance (on) and the high impedance (off) states is typically about three orders magnitude, with the on state being at about 1 k$\Omega$. Increasing hysteresis is shown at the switching point as $V_g$ became more negative, as seen in FIG. 3. Following the usual convention, a switching voltage $V_s$ and a holding voltage $V_h$ are defined and shown by example in curve D of FIG. 3. In FIG. 3, it is shown that $V_s$ and $V_h$ depend linearly, but with different slope, on $V_g$, to within experimental uncertainty. The slopes of and $V_s$ vs $V_g$ remain the same as $V_{cg}$ is changed from to zero.

As will be readily appreciated to those skilled in the art, the present invention in its most generic sense may function at any temperature. As with the embodiment described above, the only constraint is that as the substrate temperature is increased, higher values of $V_g$ are required to obtain SNDC. For example, at 8K, gate voltages in excess of $-3.5$ V are required for switching, while at 2.7K only $-2.0$ V are required.

With regard to the performance aspects of the present invention and assuming a drift velocity of $1 \times 10^7$ cm $s^{-1}$ and a characteristic device size of 500 nm, a 5 ps switching time is theoretically possible. It should be noted, however, that charge storage and other effects may well increase the switching time. The ability to control the SNDC with gate electrodes suggests a variety of high frequency applications for the devices, for example, high frequency sources, switching, amplification, and high speed signal processing.

What is claimed is:

1. A multiterminal lateral device comprising:
a heterointerface having a double real space constriction and potential barrier structure formed around an electron cache region; and
a plurality of terminals formed over the heterointerface, the terminals being configured such that an S-shaped negative differential conductance is exhibited in the device;
wherein the plurality of terminals includes at least a source and a drain terminal and a split gate configuration formed between the source and drain terminals.

2. The device of claim 1 wherein the split gate configuration forms and controls the potential barriers and wherein the heterointerface is a hot electron transistor structure.

3. The device of claim 2 wherein the hot electron transistor is comprised of an $Al_xGa_{1-x}As/GaAs$ interface where $x=0.25$, the interface being formed on an undoped GaAs layer and where the alGaAs portion of the interface includes five Si delta-doped layers, four of $1\times10^{12}$ cm$^{-2}$ and one of $3\times10^{12}$ cm$^{-2}$, and a 40 nm spacer between the lowest delta layer and the electron cache region.

4. A multiterminal lateral semiconductor device comprising:
   a split gate array formed on the semiconductor device;
   a heterointerface structure having a two dimensional electron gas which is laterally confined by the split gate and a double real space constriction and potential barrier structure, the two dimensional electron gas containing approximately fifty to three hundred electrons in a non-heated state;
   a source Shottky contact formed on one side of the split gate array on the semiconductor device; and
   a drain Shottky contact formed on an opposite side of the split gate array on the semiconductor device;
   wherein hot electrons passing through one side of the double real space constriction and potential barrier heat the electrons in the two dimensional electron gas which when heated sufficiently pass over a second side of the double real space constriction and potential barrier, thereby exhibiting an S-shaped negative differential conductance.

* * * * *